United States Patent
Yoshioka et al.

(10) Patent No.: US 10,771,057 B1
(45) Date of Patent: Sep. 8, 2020

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventors: Akira Yoshioka, Yokohama (JP); Toru Sugiyama, Musashino (JP); Masaaki Iwai, Yokohama (JP); Naonori Hosokawa, Yokohama (JP); Masaaki Onomura, Setagaya (JP); Hung Hung, Kawasaki (JP); Yasuhiro Isobe, Ota (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/745,456

(22) Filed: Jan. 17, 2020

(30) Foreign Application Priority Data

Sep. 17, 2019 (JP) .................................. 2019-168196

(51) Int. Cl.
*H03K 17/687* (2006.01)
*H02M 1/08* (2006.01)
*H03K 17/06* (2006.01)
*H01L 25/07* (2006.01)
*H02P 27/06* (2006.01)

(52) U.S. Cl.
CPC .......... *H03K 17/6871* (2013.01); *H02M 1/08* (2013.01); *H03K 17/063* (2013.01); *H01L 25/072* (2013.01); *H02P 27/06* (2013.01)

(58) Field of Classification Search
CPC ........... H03K 17/04126; H03K 17/063; H03K 2217/0036; H03K 17/0822; H03K 17/6871; H03K 17/6872; G11B 5/022; G11B 5/012; H02P 27/06; H02M 1/08; H01L 25/072

See application file for complete search history.

(56) References Cited

U.S. PATENT DOCUMENTS

| 9,236,373 | B2 | 1/2016 | Ikeda et al. | |
| 9,350,342 | B2 * | 5/2016 | Zojer | H03K 17/687 |
| 9,679,880 | B2 | 6/2017 | Ikeda | |
| 10,084,442 | B2 * | 9/2018 | Ikeda | H03K 17/0822 |
| 2015/0162321 | A1 | 6/2015 | Briere | |

FOREIGN PATENT DOCUMENTS

| JP | 2015-115608 A | 6/2015 |
| JP | 2015-185618 A | 10/2015 |
| JP | 2016-19112 A | 2/2016 |

* cited by examiner

*Primary Examiner* — Long Nguyen
(74) *Attorney, Agent, or Firm* — Oblon, McClelland, Maier & Neustadt, L.L.P.

(57) ABSTRACT

A semiconductor device of embodiments includes a first normally-off transistor having a first electrode, a second electrode, and a first control electrode, a normally-on transistor having a third electrode electrically connected to the second electrode via a first wiring, a fourth electrode, and a second control electrode, a second normally-off transistor having a fifth electrode, a sixth electrode electrically connected to the third electrode via a second wiring, and a third control electrode, a first diode having a first anode electrically connected to the second control electrode and a first cathode electrically connected to the third electrode, and a capacitor having a first end portion connected to the first anode and the second control electrode and a second end portion.

6 Claims, 7 Drawing Sheets

SEMICONDUCTOR DEVICE

CROSS-REFERENCE TO RELATED APPLICATION

This application is based upon and claims the benefit of priority from Japanese Patent Application No. 2019-168196, filed on Sep. 17, 2019, the entire contents of which are incorporated herein by reference.

FIELD

Embodiments described herein relate generally to Semiconductor Device.

BACKGROUND

As a material for next-generation power semiconductor devices, a group-III nitride, for example, a GaN (gallium nitride)-based semiconductor has been expected. The GaN-based semiconductor has a large bandgap in comparison with Si (silicon). For this reason, in comparison with an Si (silicon) semiconductor device, by using a GaN-based semiconductor device, a power semiconductor device with a small size and a high breakdown voltage can be implemented. In addition, accordingly, a parasitic capacitance can be reduced, and thus, a power semiconductor device with high-speed driving can be implemented.

Generally, a high electron mobility transistor (HEMT) structure using a two-dimensional electron gas (2DEG) as carriers is applied to a GaN-based transistor. A typical HEMT is a normally-on transistor which becomes conductive even when no voltage is applied to the gate. For this reason, there is a problem in that it is difficult to implement a normally-off transistor which does not become conductive if no voltage is applied to the gate.

In such a power supply circuit for dealing with a large power of several hundred volts to one thousand volts, the normally-off operation is required in terms of emphasis on safety. Therefore, a circuit configuration for implementing the normally-off operation by performing a cascode connection of connecting a normally-on GaN-based transistor and a normally-off Si transistor has been proposed.

In addition, in the case of a circuit configuration where a main circuit current flowing between the drain and the source and a driving current flowing between the gate and the source share a source inductance, due to the electromotive force generated in the source inductance with a time change of the main circuit current, a driving current is also modulated. As problems generated along with this, there is a problem of delay such as reduction in a rising speed or a falling speed of a power semiconductor device or a problem of ringing as a rapid time change of the drain current and the source voltage. Therefore, a circuit configuration using Kelvin connection where the main circuit current and the gate driving current do not share the source inductance has been proposed.

DETAILED DESCRIPTION

Figure 1:
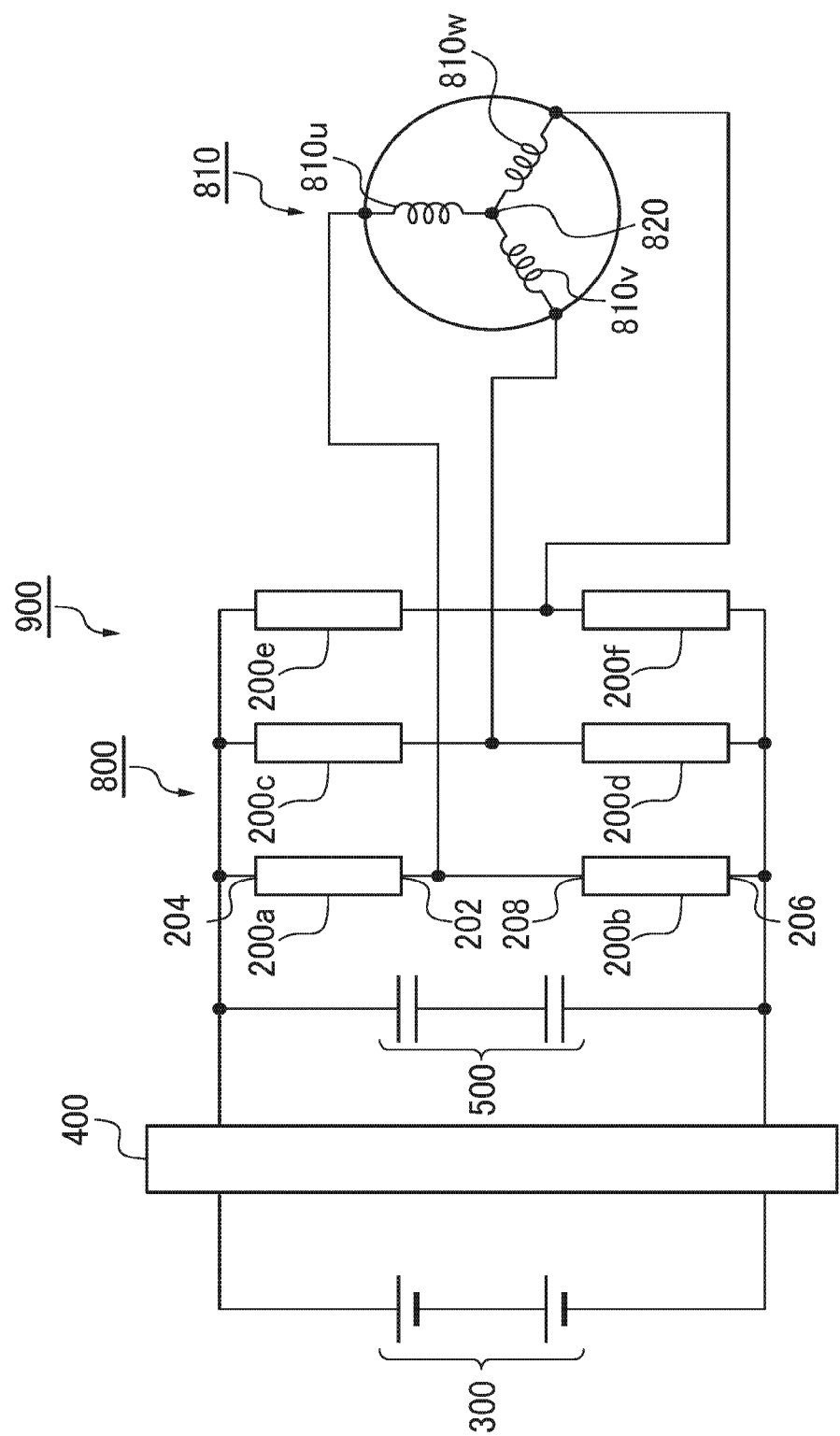
FIG. 1 is a schematic diagram of a power conversion system of a first embodiment.

A semiconductor device of the embodiment includes: a first normally-off transistor having a first electrode, a second electrode, and a first control electrode; a normally-on transistor having a third electrode electrically connected to the second electrode via a first wiring, a fourth electrode, and a second control electrode; a second normally-off transistor having a fifth electrode, a sixth electrode electrically connected to the third electrode via a second wiring, and a third control electrode; a first diode having a first anode electrically connected to the second control electrode and a first cathode electrically connected to the third electrode; and a capacitor having a first end portion connected to the first anode and the second control electrode and a second end portion.

Hereinafter, embodiments will be described with reference to the accompanying drawings. In addition, in the following description, in some cases, the same or similar members are denoted by the same reference numerals. In addition, in some cases, description of the once-described member or the like is omitted as appropriate.

In addition, in this specification, a semiconductor device is a concept including a power module obtained by incorporating a plurality of elements such as discrete semiconductors, an intelligent power module obtained by incorporating a drive circuit for driving a plurality of elements such as discrete semiconductors or a self protection function into the plurality of elements, or an entire system including the power module or the intelligent power module.

In addition, in this specification, a "GaN-based semiconductor" is a generic name of semiconductors having GaN (gallium nitride), AlN (aluminum nitride), InN (indium nitride), and an intermediate composition thereof.

First Embodiment

A semiconductor device of this embodiment includes: a first normally-off transistor having a first electrode, a second electrode, and a first control electrode; a normally-on transistor having a third electrode electrically connected to the second electrode via a first wiring, a fourth electrode, and a second control electrode; a second normally-off transistor having a fifth electrode, a sixth electrode electrically connected to the third electrode via a second wiring, and a third control electrode; a first diode having a first anode electrically connected to the second control electrode and a first cathode electrically connected to the third electrode; and a capacitor having a first end portion connected to the first anode and the second control electrode and a second end portion.

In addition, the semiconductor device of this embodiment further includes: a resistor having a third end portion electrically connected to the first control electrode and the third control electrode and a fourth end portion electrically connected to the second end portion; a second diode having a second anode electrically connected to the second end portion and the fourth end portion and a second cathode connected to the first control electrode, the third control electrode, and the third end portion and being provided in parallel with the resistor; and a first gate drive circuit electrically connected to the first control electrode, the third control electrode, and the second end portion.

FIG. 1 is a schematic diagram of a power conversion system 900 of this embodiment.

The power conversion system 900 includes a power conversion device 800 and a motor 810.

The power conversion device 800 includes transistors 200a, 200b, 200c, 200d, 200e, and 200f, a DC power supply 300, a converter 400, and a smoothing capacitor 500. In addition, as described below, the transistors 200a, 200b, 200c, 200d, 200e, and 200f may also include a plurality of transistors and the other elements.

The DC power supply 300 outputs a DC voltage. The converter 400 is a DC-DC converter and converts the DC voltage output by the DC power supply 300 to other DC voltage. The smoothing capacitor 500 smoothes the voltage output by the converter 400.

Each of the transistors 200a, 200b, 200c, 200d, 200e, and 200f includes a semiconductor device 100 or a semiconductor device 110 described later. The DC voltage smoothed by the smoothing capacitor 500 is converted into an AC voltage by the transistors 200a, 200b, 200c, 200d, 200e, and 200f.

For example, the transistor 200a has a first transistor electrode 202 and a second transistor electrode 204. The transistor 200b has a third transistor electrode 206 and a fourth transistor electrode 208. The transistor 200a and the transistor 200b are electrically connected to each other by electrically connecting the first transistor electrode 202 and the fourth transistor electrode 208.

Similarly, the transistor 200c and transistor 200d are electrically connected to each other, and the transistor 200e and the transistor 200f are electrically connected to each other.

The motor 810 has coils 810u, 810v, and 810w. Ends of the coils 810u, 810w, and 810v are electrically connected to each other at a neutral point 820. The other end of the coil 810u is electrically connected between the transistor 200a and the transistor 200b. The other end of the coil 810v is electrically connected between the transistor 200c and transistor 200d. In addition, the other end of the coil 810w is electrically connected between the transistor 200e and the transistor 200f.

In addition, the ground in the power conversion device 800 of this embodiment may be electrically connected, for example, between the plurality of smoothing capacitors 500 provided. In addition, the ground in the power conversion device 800 may be electrically connected to, for example, a wire where the transistor 200b, the transistor 200d, and the transistor 200f are electrically connected to each other.

Figure 2:
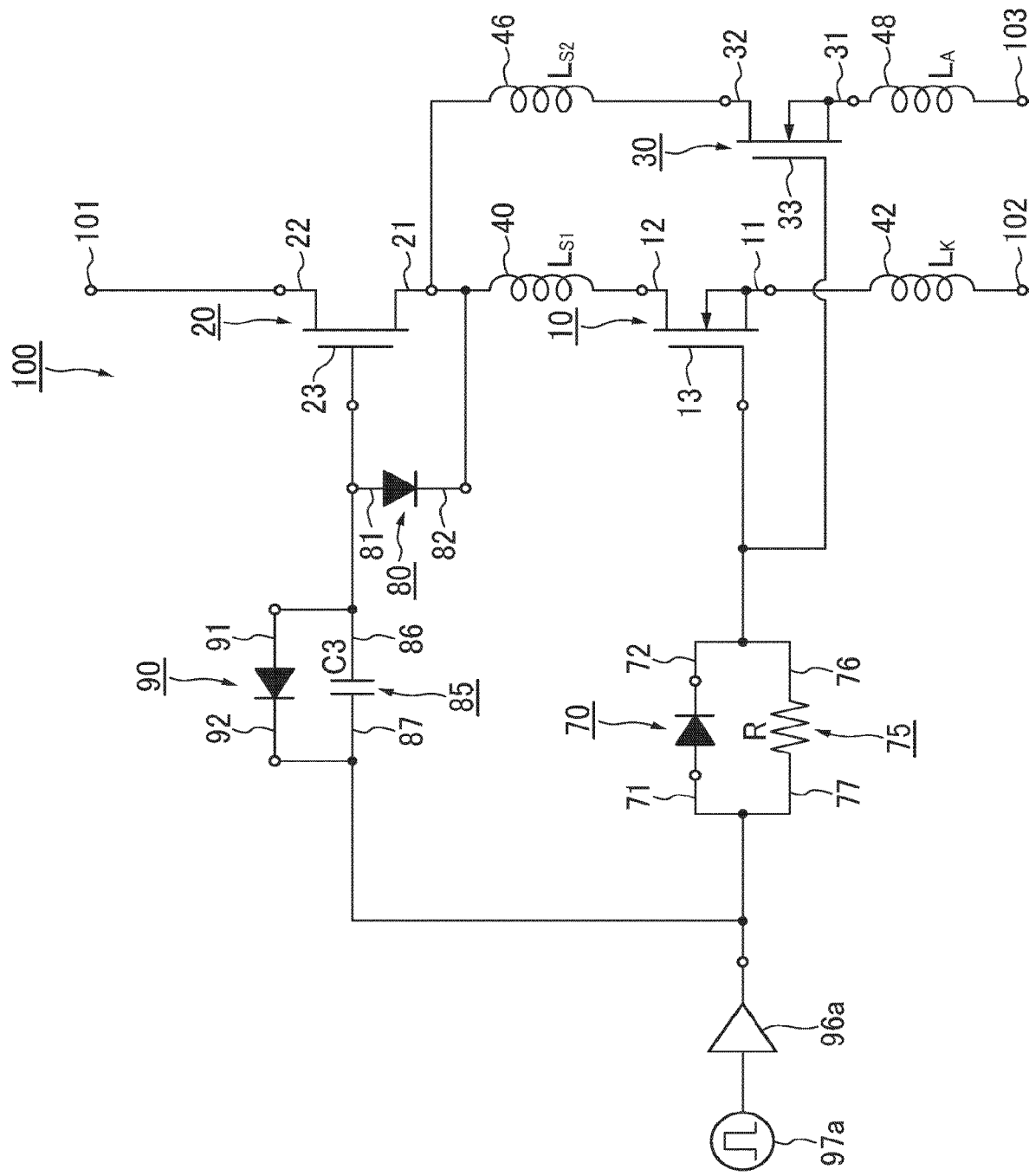
FIG. 2 is a circuit diagram of a semiconductor device of the first embodiment.

FIG. 2 is a circuit diagram of the semiconductor device 100 of this embodiment. The semiconductor device 100 of this embodiment is a power module having a rated voltage of, for example, 600 V and 1200 V.

The semiconductor device 100 includes a first normally-off transistor 10, a normally-on transistor 20, a second normally-off transistor 30, a first diode 80, a capacitor 85, a resistor 75, a second diode 70, a third diode 90, a first gate drive circuit 96a, and a signal source 97a.

The first normally-off transistor 10 has a first electrode 11, a second electrode 12, and a first control electrode 13.

The first normally-off transistor 10 is a transistor in which a drain current does not flow in a case where a voltage is not input to the gate. The first normally-off transistor 10 is, for example, an n-type metal oxide semiconductor field effect transistor (MOSFET) using an Si (silicon) semiconductor. For example, the first electrode 11 is the source electrode, the second electrode 12 is the drain electrode, and the first control electrode 13 is the gate electrode. However, the first normally-off transistor 10 is not limited thereto. For example, the first normally-off transistor 10 may be a p-type MOSFET. In addition, the first normally-off transistor 10 has a parasitic body diode (not illustrated). In addition, the breakdown voltage of the first normally-off transistor 10 is, for example, 10 V or more and 30 V or less.

A third wiring 42 is connected to the first electrode 11. The third wiring 42 has, for example, an inductance $L_k$. The third wiring 42 is connected to a source terminal 102. The source terminal 102 is connected to the ground (not illustrated).

The normally-on transistor 20 has a third electrode 21, a fourth electrode 22, and a second control electrode 23. The third electrode 21 is electrically connected to the second electrode 12 via a first wiring 40. The first wiring 40 has an inductance $L_{s1}$.

The normally-on transistor 20 is a transistor in which a drain current flows even in a case where a voltage is not input to the gate. The normally-on transistor 20 is, for example, a high electron mobility transistor (HEMT) using a GaN-based semiconductor. For example, the third electrode 21 is the source electrode, the fourth electrode 22 is the drain electrode, and the second control electrode 23 is the gate electrode. The fourth electrode is electrically connected to a drain terminal 101.

The breakdown voltage of the normally-on transistor 20 is higher than the breakdown voltage of the first normally-off transistor 10. The breakdown voltage of the normally-on transistor 20 is, for example, 600 V or more and 1200 V or less.

The semiconductor device 100 of this embodiment implements a normally-off operation by electrically connecting the first normally-off transistor 10 and the normally-on transistor 20 in series. For example, in a case where the semiconductor device 100 is used in the transistor 200b (FIG. 1), the third transistor electrode 206 is electrically connected to the first electrode 11, and the fourth transistor electrode 208 is electrically connected to the fourth electrode 22.

The second normally-off transistor 30 has a fifth electrode 31, a sixth electrode 32, and a third control electrode 33. The sixth electrode 32 is electrically connected to the third electrode 21 via a second wiring 46. The second wiring 46 has an inductance $L_{s2}$.

The second normally-off transistor 30 is a transistor in which a drain current does not flow in a case where a voltage is not input to the gate. The second normally-off transistor 30 is, for example, an n-type metal oxide semiconductor field effect transistor (MOSFET) using an Si (silicon) semiconductor. For example, the fifth electrode 31 is the source electrode, the sixth electrode 32 is the drain electrode, and the third control electrode 33 is the gate electrode. However, the second normally-off transistor 30 is not limited thereto. For example, the second normally-off transistor 30 may be a p-type MOSFET. In addition, the second normally-off transistor 30 has a parasitic body diode (not illustrated). In addition, the breakdown voltage of the second normally-off transistor 30 is, for example, 10 V or more and 30 V or less.

A fourth wiring 48 is connected to the fifth electrode 31. The fourth wiring 48 has, for example, an inductance $L_4$. The fifth electrode 31 is connected to a Kelvin terminal 103. The Kelvin terminal 103 is connected to the ground (not illustrated).

The first diode 80 has a first anode 81 and a first cathode 82. The first anode 81 is electrically connected to the second control electrode 23. The first cathode 82 is electrically connected to the third electrode 21. In addition, the first cathode 82 is electrically connected to the second electrode 12 via the first wiring 40 and is electrically connected to the sixth electrode 32 via the second wiring 46.

The capacitor 85 has a first end portion 86 and a second end portion 87. The first end portion 86 is electrically connected to the first anode 81 and the second control electrode 23.

The resistor 75 has a third end portion 76 and a fourth end portion 77. The third end portion 76 is electrically connected to the first control electrode 13 and the third control electrode 33. The fourth end portion 77 is electrically connected to the second end portion 87.

The second diode 70 has a second anode 71 and a second cathode 72. The second anode 71 is electrically connected to the second end portion 87 and the fourth end portion 77. The second cathode 72 is electrically connected to the first control electrode 13, the third control electrode 33, and the third end portion 76. The second diode 70 is electrically provided in parallel with the resistor 75.

The third diode 90 has a third anode 91 and a third cathode 92. The third anode 91 is electrically connected to the second control electrode 23, the first anode 81, and the first end portion 86. The third cathode 92 is electrically connected to the second end portion 87, the second anode 71, and the fourth end portion 77. The third diode 90 is electrically provided in parallel with the capacitor 85.

The first diode 80, the second diode 70, and the third diode 90 are preferably Schottky barrier diodes having a high response speed. In addition, the first diode 80, second diode 70 and the third diode 90 may be PN junction diodes, and even in the case, the diodes can be preferably used.

It is preferable that the capacitor 85 is a ceramic capacitor. This is because a ceramic capacitor is excellent in frequency characteristic. However, the capacitor 85 may be other film capacitors, aluminum electrolytic capacitors, or tantalum electrolytic capacitors, and even in the case, the capacitors can be preferably used.

The signal source 97a outputs a signal of, for example, a square wave or the like.

The first gate drive circuit 96a is connected to the signal source 97a, the second anode 71, the fourth end portion 77, the second end portion 87, and the third cathode 92. Then, the first gate drive circuit 96a is electrically connected to the first control electrode 13 and the third control electrode 33 via the resistor 75. The first gate drive circuit 96a outputs signals for driving the first normally-off transistor 10, the normally-on transistor 20, and the second normally-off transistor 30 on the basis of the signals output from the signal source 97a.

The first gate drive circuit 96a is an IC obtained by incorporating a plurality of elements into one chip or an electronic circuit board on which a plurality of electronic components are arranged.

When the on-resistance of the first normally-off transistor 10 is denoted by $R_{on1}$, the on-resistance of the second normally-off transistor 30 is denoted by $R_{on2}$, the inductance of the first wiring 40 is denoted by $L_{s1}$, and the inductance of the second wiring 46 is denoted by $L_{s2}$, it is preferable that $(R_{on2} \times L_{s1}) (R_{on1} \times L_{s2}) > 2$.

In addition, it is preferable that $R_{on1} < R_{on2}$.

Figure 3:
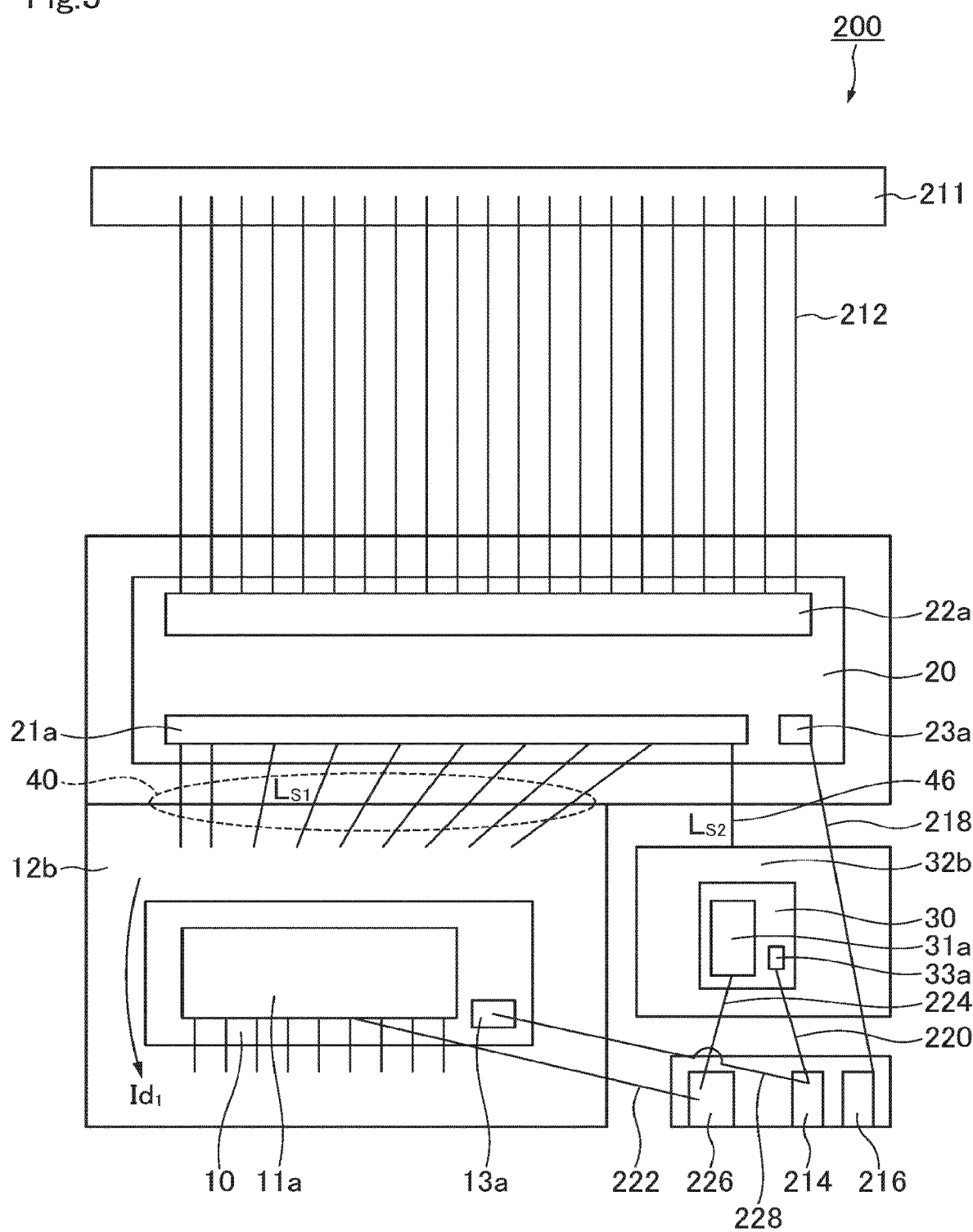
FIG. 3 is a schematic top view of a semiconductor package of the first embodiment.

FIG. 3 is a schematic top view of a semiconductor package 200 of this embodiment. FIG. 2 illustrates an example of a semiconductor package in the case of using vertical n-type Si-MOSFETs as the first normally-off transistor 10 and the second normally-off transistor 30 and using a GaN-HEMT as the normally-on transistor 20.

A source pad 11a electrically connected to the first electrode 11 and a gate pad 13a electrically connected to the first control electrode 13 are provided on the upper surface of the first normally-off transistor 10. In addition, a drain frame 12b electrically connected to the second electrode 12 is provided.

A source pad 21a electrically connected to the third electrode 21, a drain pad 22a electrically connected to the fourth electrode 22, and a gate pad 23a electrically connected to the second control electrode 23 are provided on the upper surface of the normally-on transistor 20.

A source pad 31a electrically connected to the fifth electrode 31 and a gate pad 33a electrically connected to the third control electrode 33 are provided on the upper surface of the second normally-off transistor 30. In addition, a drain frame 32b electrically connected to the sixth electrode 32 is provided. In addition, the gate pad 13a and the gate pad 33a may also be a single pad which is integrated by being connected by a wiring provided inside the semiconductor package 200.

A drain frame 211 is a frame made of, for example, Cu (copper). The drain frame 211 corresponds to the drain terminal 101 (FIG. 2). The drain frame 211 is connected to the drain pad 22a of the normally-on transistor 20 by using a wire 212. The wire 212 is, for example, a bonding wire. It is preferable that the drain frame 211 and the drain pad 22a are connected by a plurality of wires 212 in order to reduce the magnitude of the resistance.

The source pad 21a and the drain frame 12b are electrically connected to each other by using the first wiring 40. The first wiring 40 is, for example, a plurality of wires. That is, the plurality of wires as the first wiring 40 has at least a portion of the inductance $L_{s1}$.

The source pad 11a is electrically connected to a pad 226 by using a wire 222. In addition, the source pad 21a and the drain frame 32b are electrically connected to each other by using the second wiring 46. The second wiring 46 has at least a portion of the inductance $L_{s2}$. The source pad 31a is electrically connected to the pad 226 by using a wire 224. It is considered that the pad 226 correspond to a member that simultaneously serves as the source terminal 102 and the Kelvin terminal 103.

The gate pad 23a is electrically connected to a pad 216 by using a wire 218. The first gate drive circuit 96a is connected to the pad 216. The gate pad 13a is electrically connected to a pad 214 by using a wire 228. The gate pad 33a is electrically connected to the pad 214 by using a wire 220. The first gate drive circuit 96a is connected to the pad 214.

Figure 4:
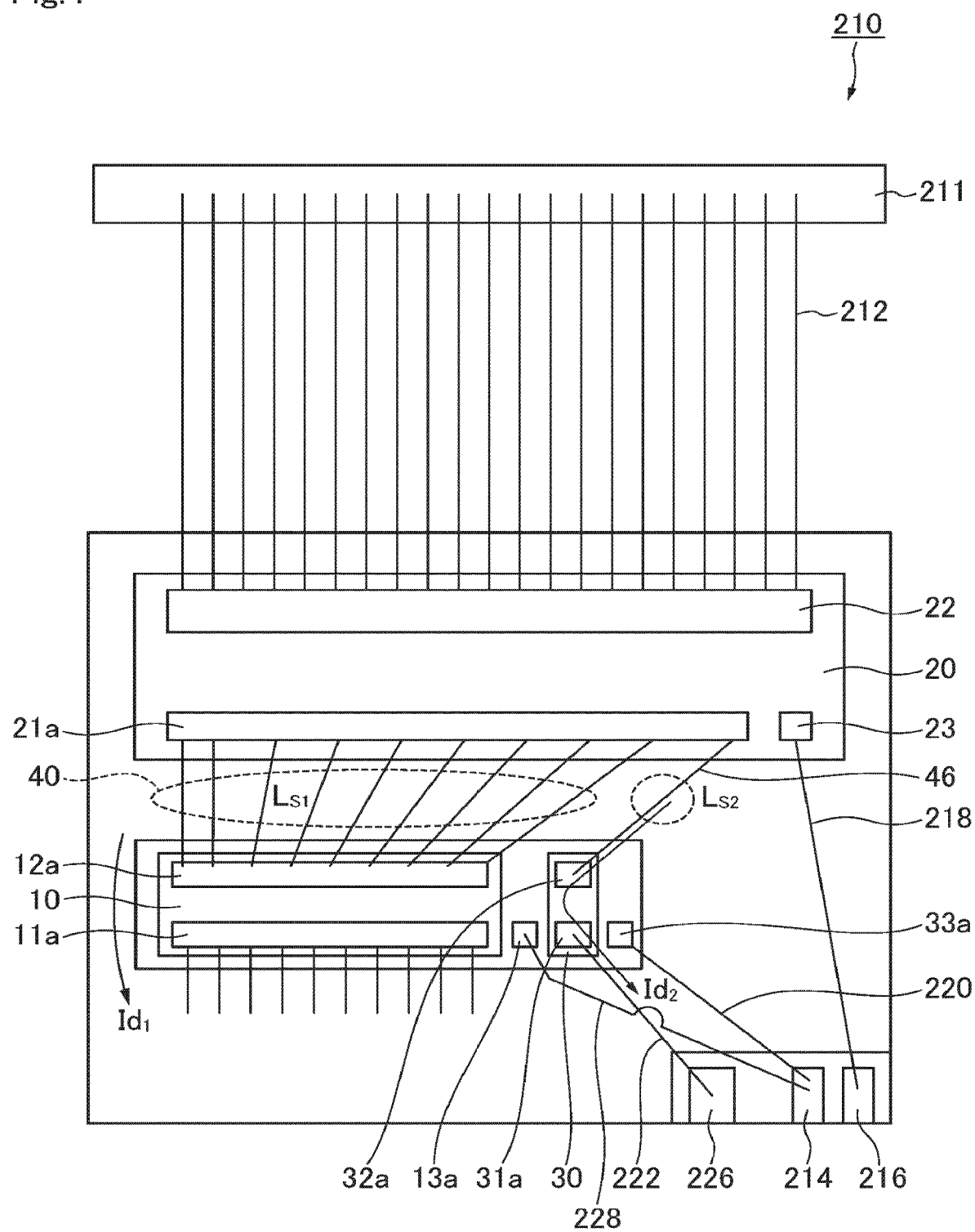
FIG. 4 is a schematic top view of a semiconductor package of another aspect of the first embodiment.

FIG. 4 is a schematic top view of a semiconductor package 210 of another aspect of this embodiment. FIG. 4 illustrates an example of a semiconductor package in the case of using horizontal n-type Si-MOSFETs as the first normally-off transistor 10 and the second normally-off transistor 30 and using a GaN-HEMT as the normally-on transistor 20.

In FIG. 4, a source pad 11a electrically connected to the first electrode 11, a drain pad 12a electrically connected to the second electrode 12, and a gate pad 13a electrically connected to the first control electrode 13 are provided on the upper surface of the first normally-off transistor 10. In addition, the source pad 21a and the drain pad 12a are electrically connected to each other via the first wiring 40.

In addition, the source pad 31a electrically connected to the fifth electrode 31, a drain pad 32a electrically connected to the sixth electrode 32, and the gate pad 33a electrically connected to the third control electrode 33 are provided on the upper surface of the second normally-off transistor 30. In addition, the source pad 21a and the drain pad 32a are electrically connected to each other via the second wiring 46.

In addition, the shape of the semiconductor package of this embodiment is not limited to the above.

Next, operations of the semiconductor device 100 of this embodiment are described.

For example, a case is considered where a square wave which reciprocates between 0 V and $V_{g\_on}$ is output by using the signal source 97a and the first gate drive circuit 96a.

Figure 5A:
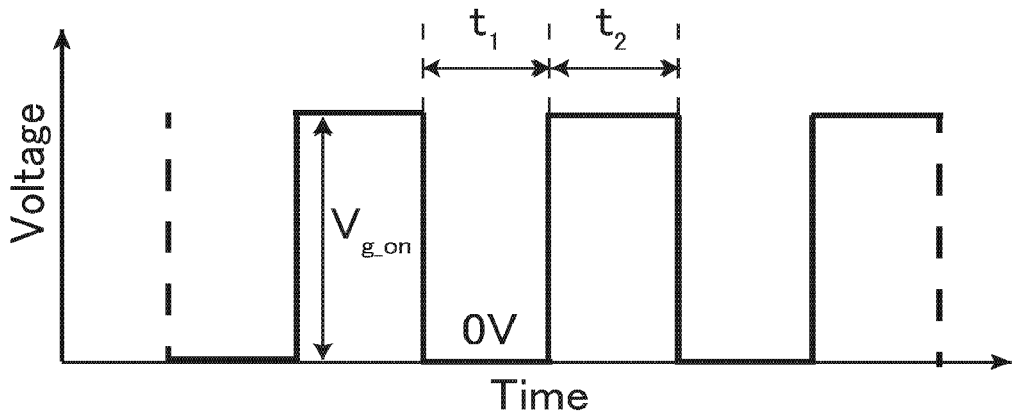
FIGS. 5A to 5C are schematic diagrams illustrating examples of $V_{g\_on}$.
Figure 5B:
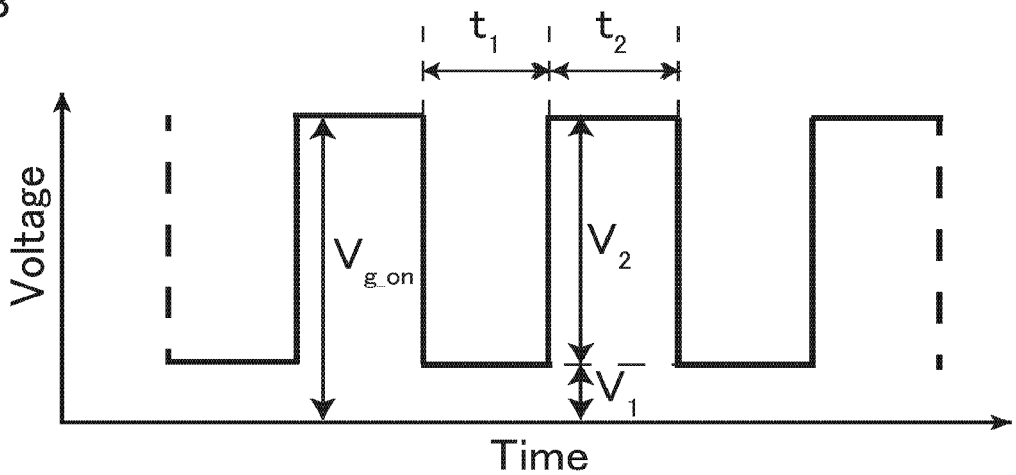
Figure 5C:
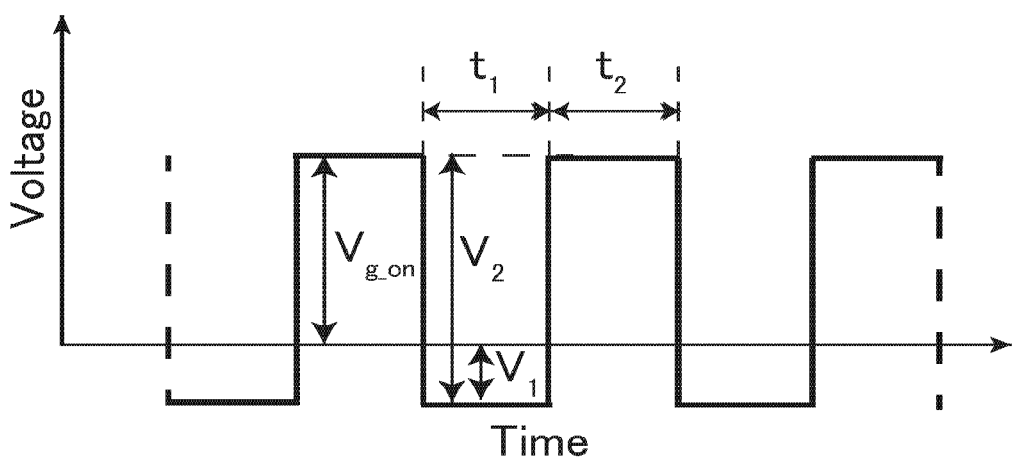

FIGS. 5A to 5C are schematic diagrams illustrating examples of $V_{g\_on}$. FIG. 5A illustrates a case where the output voltage of the first gate drive circuit 96a is a square wave where 0 V output during the time $t_1$ and $V_{g\_on}$ output during the time $t_2$ repeat. FIG. 5B illustrates a case where the output voltage of the first gate drive circuit 96a is a square wave where $V_1$ output during the time $t_1$ and a sum of $V_1$ and $V_2$ output during the time $t_2$ repeat. In the case of FIG. 5B, $V_{g\_on}=V_1+V_2$ ($V_{g\_on}=|V_1|+|V_2|$). FIG. 5C illustrates a case where a negative voltage is output during the time $t_1$. In the case of FIG. 5C, $V_{g\_on}=|V_2|-|V_1|$. Thus, the output voltage of the first gate drive circuit 96a is a time varying voltage. Then, for example, the maximum voltage of the output voltages of the first gate drive circuit 96a is $V_{g\_on}$. In addition, although $t_1=t_2$ is illustrated as FIGS. 5A to 5C, $t_2$ and $t_2$ may be different. In addition, the time varying manner of the output voltage of the first gate drive circuit 96a is not limited to those illustrated in FIGS. 5A to 5C. In addition, $V_{g\_on}$ can be easily measured by using a commercially available oscilloscope. In addition, $V_{g\_on}$ is the voltage measured by setting the voltage of the source terminal 102 or the voltage of the first electrode 11 as a reference. Herein, the phrase "setting the voltage . . . as a reference" denotes, for example, "setting the voltage . . . to 0 V".

When $V_{g\_on}$ is output from the first gate drive circuit 96a, a current flows from the capacitor 85 via the first diode 80. A voltage corresponding to a forward voltage $V_F$ of the first diode 80 is input between the second control electrode 23 and the third electrode 21. As a result, the normally-on transistor 20 is turned "on". On the other hand, when 0 V is output from the first gate drive circuit 96a, a current reversely flows to the capacitor 85 via a parasitic capacitance $C_{gs}$ (not illustrated) of the normally-on transistor 20. A negative voltage ($V_F-V_{g\_on}$) corresponding to the difference between $V_F$ and $V_{g\_on}$ is input between the second control electrode 23 and the third electrode 21. Thus, it is possible to turn "off" the normally-on transistor 20.

In addition, if $V_{g\_on}$ is higher than the threshold voltage of the first normally-off transistor 10 and the threshold voltage of the second normally-off transistor 30, the first normally-off transistor 10 and the second normally-off transistor 30 can be turned "on" when $V_{g\_on}$ is output from the first gate drive circuit 96a.

Herein, when the semiconductor device 100 is transitioned from the "off" state to the "on" state, it is preferable that the first normally-off transistor 10 and the second normally-off transistor 30 are turned "on" earlier than the normally-on transistor 20. If the normally-on transistor 20 is turned "on" earlier, high voltages are applied to a connection portion between the second electrode 12 and the third electrode 21 and a connection portion between the sixth electrode 32 and the third electrode 21, and thus, there is a concern that the characteristics of the first normally-off transistor 10 and the second normally-off transistor 30 having a low breakdown voltage are deteriorated.

In the semiconductor device 100 of this embodiment, when the semiconductor device 100 is to be transitioned from the "off" state to the "on" state, the current output from the first gate drive circuit 96a flows through the second diode 70. For this reason, the charging of the first control electrode 13 and the third control electrode 33 is not affected by the resistor 75. Accordingly, the first control electrode 13 and the third control electrode 33 can be rapidly charged. Thus, when the semiconductor device 100 is shifted from the "off" state to the "on" state, it is possible to reliably turn "on" the first normally-off transistor 10 and the second normally-off transistor 30 earlier than normally-on transistor 20.

In addition, by providing the resistor 75, the timing of turning "off" the first normally-off transistor 10 and the second normally-off transistor 30 can be delayed by a desired time from the timing of turning "off" the normally-on transistor 20. Furthermore, by the design of the characteristics of the second diode 70, the resistance value of the resistor 75, and the shape of the square wave, it is also possible to maintain the "on" state of the first normally-off transistor 10 and the "on" state of the second normally-off transistor 30.

In addition, a case is considered where 0 V is output by the signal source 97a and the first gate drive circuit 96a, and thus, the first normally-off transistor 10, the normally-on transistor 20, and the second normally-off transistor 30 are turned "off". If a high voltage is applied to the fourth electrode 22, the voltage of the third electrode 21 becomes high. At this time, there is a concern that the "off" state of the normally-on transistor 20 may not be maintained. For this reason, by providing the third diode 90, the first gate drive circuit 96a and the second control electrode 23 are short-circuited, so that the "off" state of the normally-on transistor 20 is maintained.

Next, functions and effects of the semiconductor device of this embodiment are described.

Figure 6:
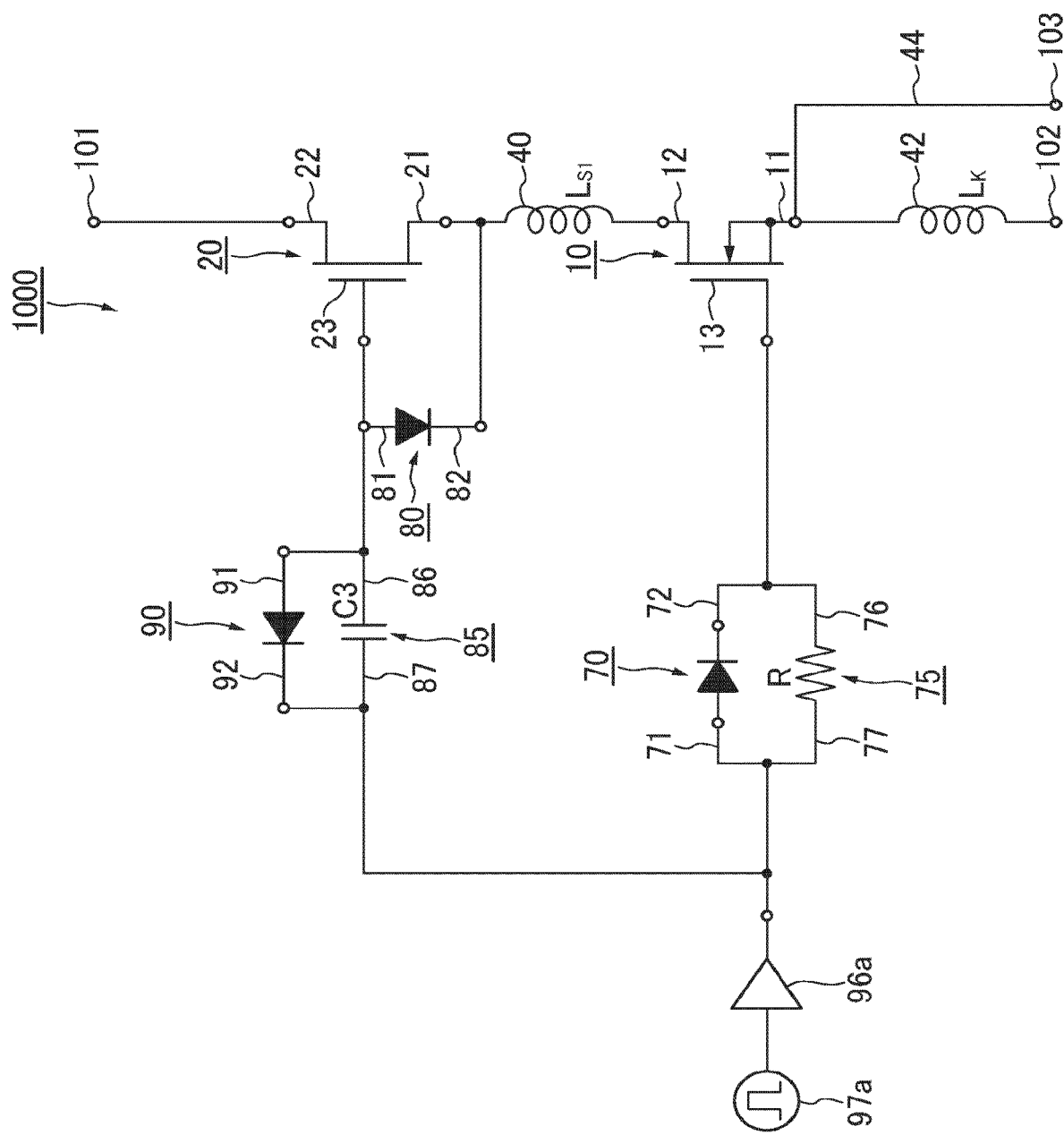
FIG. 6 is a circuit diagram of a semiconductor device as a comparative form of the first embodiment.

FIG. 6 is a circuit diagram of a semiconductor device 1000 according to a comparative form of this embodiment.

A case is considered where the ground of the first gate drive circuit 96a is connected to the third wiring 42 and is taken from the third wiring 42. Herein, the main circuit current of the semiconductor device 100 flows through the first wiring 40, the first normally-off transistor 10, and the third wiring 42. For this reason, the ground potential of the first gate drive circuit 96a is deviated from the potential of the third electrode 21 by at least the electromotive force generated due to the inductance $L_{s1}$ of the first wiring 40 and the electromotive force generated due to the inductance $L_k$ of the third wiring 42. Herein, in a power module such as the semiconductor device 100, the main circuit current is very large, and the time change is also large. Therefore, the ground potential of the first gate drive circuit 96a is greatly deviated from the potential of the third electrode 21. Since the semiconductor device 100 preforms an operation that is not originally intended, it is considered that noise is generated from the semiconductor device 100. For this reason, there is a problem in that a predetermined voltage from the first gate drive circuit 96a cannot be applied between the second control electrode 23 and the third electrode 21.

Next, performing the Kelvin connection is considered. If the wiring 44 is connected to the third electrode 21 and the ground of the first gate drive circuit 96a is taken from the wiring 44, the ground potential of the first gate drive circuit 96a can be closer to the potential of the third electrode 21.

However, in this case, since the main circuit current flows through the wiring 44 by short-circuiting the first normally-off transistor 10, the normally-off operation cannot be implemented.

Therefore, it is considered that the Kelvin connection is performed by connecting the wiring 44 to the first electrode 11 and connecting the ground of the first gate drive circuit 96a to the wiring 44. Accordingly, it is possible to suppress the deviation of the ground potential of the first gate drive circuit 96a and the potential of the third electrode 21 due to the electromotive force generated from the inductance $L_k$ of the third wiring 42. However, there is a problem in that the deviation of the potential due to the electromotive force generated from the inductance $L_{s1}$ of the first wiring 40 is not removed.

In the semiconductor device 100 of this embodiment, the second normally-off transistor 30 is connected via the second wiring 46. Then, the ground of the first gate drive circuit 96a is taken by being connected to the fourth wiring 48. Accordingly, it is possible to suppress the deviation of the ground potential of the first gate drive circuit 96a and the potential of the third electrode 21 due to the electromotive force generated by the inductance $L_{s1}$ of the first wiring 40 and the electromotive force generated by the inductance $L_k$ of the third wiring 42. Accordingly, noise of the semiconductor device 100 is reduced, and a predetermined voltage from the first gate drive circuit 96a can be applied between the second control electrode 23 and the third electrode 21, thus the semiconductor device 100 can perform a predetermined operation (noise of the semiconductor device 100 is reduced).

In addition, in the semiconductor device 100, in order to accurately obtain the potential of the third electrode 21, it is preferable that the electromotive force generated due to the inductance $L_{s2}$ of the second wiring 46 is smaller than the electromotive force generated due to the inductance $L_{s1}$ of the first wiring 40.

Herein, when the current flowing through the first wiring 40 is denoted by $I_{d1}$, the electromotive force generated due to the inductance $L_{s1}$ is proportional to $L_{s1} \times (d(I_{d1})/dt)$. Herein, $d(I_{d1})/dt$ is inversely proportional to the on-resistance $R_{on1}$ the first normally-off transistor 10. For this reason, the electromotive force generated due to the inductance $L_{s1}$ is proportional to $L_{s1}/R_{on1}$. Similarly, the electromotive force generated due to the inductance $L_{s2}$ is proportional to $L_{s2}/R_{on2}$. Herein, $R_{on2}$ is the on-resistance of the second normally-off transistor 30.

Specifically, it is preferable that the electromotive force generated due to the inductance $L_{s1}$ of the first wiring 40 is twice or more larger than the electromotive force generated due to the inductance $L_{s2}$ of the second wiring 46. That is, it is preferable that $(L_{s1}/R_{on1}) > (L_{s2}/R_{on2}) \times 2$. Alternatively, as a modification of the above equation, it is preferable that $(R_{on2} \times L_{s1})(R_{on1} \times L_{s2}) > 2$.

In addition, it is preferable that no large current flows in the second wiring 46, the second normally-off transistor 30, and the fourth wiring 48 for the Kelvin connection as compared to the first wiring 40, the first normally-off transistor 10, and the third wiring 42. This is to accurately obtain the potential of the third electrode 21. For this reason, it is preferable that $R_{on1} < R_{on2}$.

According to the semiconductor device of this embodiment, it is possible to provide a semiconductor device with noise reduced.

Second Embodiment

A semiconductor device of this embodiment is different from the semiconductor device of the first embodiment in that the semiconductor device further includes a second gate drive circuit electrically connected to the second end portion and a third gate drive circuit electrically connected to the first control electrode and the third control electrode. Herein, description of contents overlapped with the first embodiment is omitted.

Figure 7:
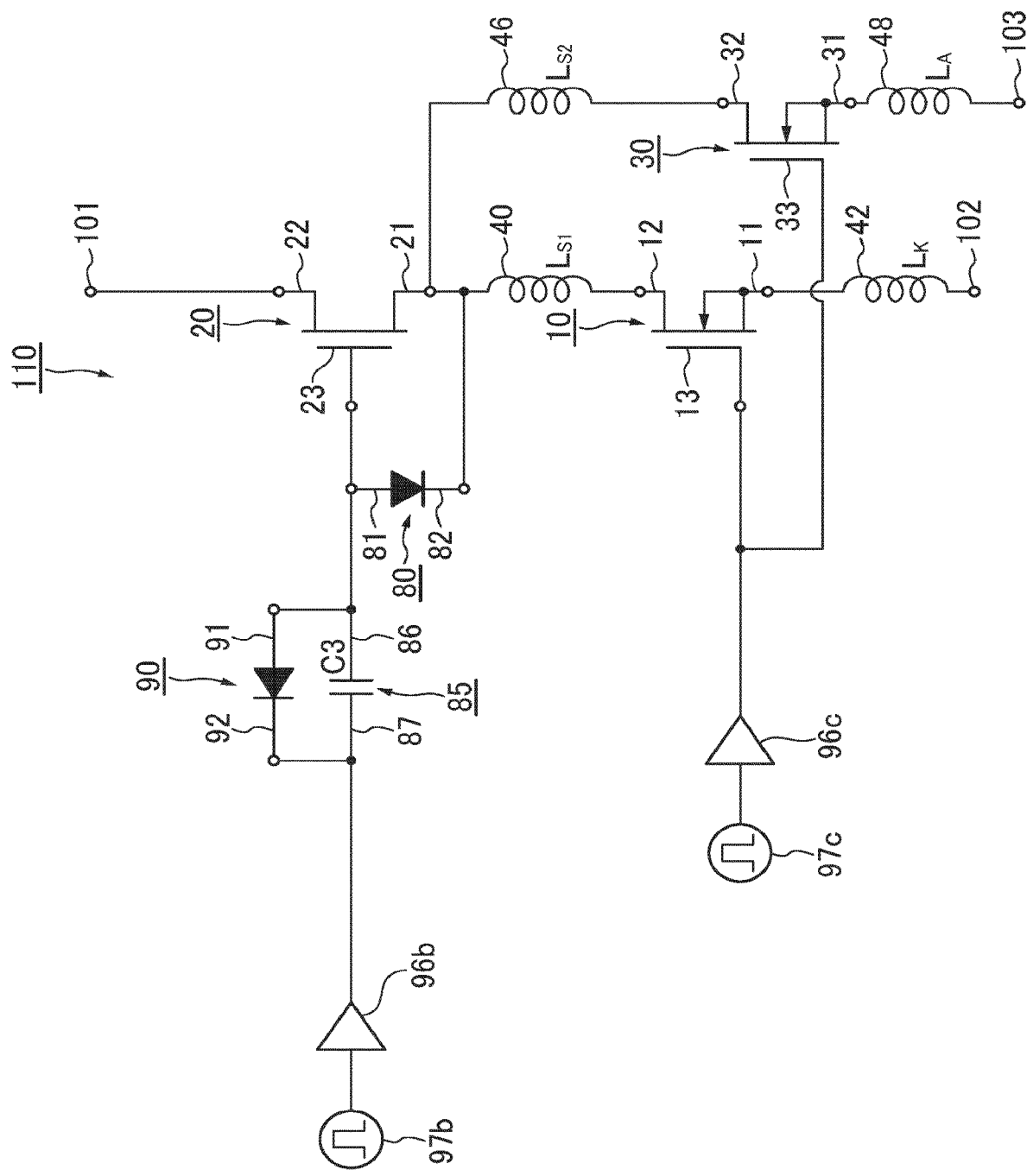
FIG. 7 is a circuit diagram of a semiconductor device of a second embodiment.

FIG. 7 is a circuit diagram of a semiconductor device 120 of this embodiment.

A signal source 97b and a second gate drive circuit 96b are provided for driving the normally-on transistor 20. In addition, a signal source 97c and a third gate drive circuit 96c are provided for driving the first normally-off transistor 10 and the second normally-off transistor 30. That is, the normally-on transistor 20 and the first normally-off transistor 10 and the second normally-off transistor 30 are driven by using separate gate drive circuits and signal sources. The ground of the second gate drive circuit 96b is taken from the fourth wiring 48. The ground of the third gate drive circuit 96c is taken from the third wiring 42. In addition, since the separate gate drive circuits and signal sources are provided, the resistor 75 and the second diode 70 are not provided. In addition, the resistor 75 and the second diode 70 may be provided.

According to the semiconductor device of this embodiment, it is possible to provide a semiconductor device with noise reduced.

While certain embodiments have been described, these embodiments have been presented by way of example only, and are not intended to limit the scope of the inventions. Indeed, SEMICONDUCTOR DEVICE described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first normally-off transistor having a first electrode, a second electrode, and a first control electrode;
   a normally-on transistor having a third electrode electrically connected to the second electrode via a first wiring, a fourth electrode, and a second control electrode;
   a second normally-off transistor having a fifth electrode, a sixth electrode electrically connected to the third electrode via a second wiring, and a third control electrode;
   a first diode having a first anode electrically connected to the second control electrode and a first cathode electrically connected to the third electrode; and
   a capacitor having a first end portion connected to the first anode and the second control electrode and a second end portion.

2. The semiconductor device according to claim 1, wherein, when an on-resistance of the first normally-off transistor is denoted by $R_{on1}$, an on-resistance of the second normally-off transistor is denoted by $R_{on2}$, an inductance of the first wiring is denoted by $L_{s1}$, and an inductance of the second wiring is denoted by $L_{s2}$, $$(R_{on2} \times L_{s1})/(R_{on1} \times L_{s2}) > 2.$$

3. The semiconductor device according to claim 2, wherein $R_{on1} < R_{on2}$.

4. The semiconductor device according to claim 1, further comprising:

a resistor having a third end portion electrically connected to the first control electrode and the third control electrode, and a fourth end portion electrically connected to the second end portion; and a second diode having a second anode electrically connected to the second end portion and the fourth end portion and a second cathode connected to the first control electrode, the third control electrode, and the third end portion and being provided in parallel with the resistor.

5. The semiconductor device according to claim 1, further comprising a first gate drive circuit electrically connected to the first control electrode, the third control electrode, and the second end portion.

6. The semiconductor device according to claim 1, further comprising:

a second gate drive circuit electrically connected to the second end portion; and a third gate drive circuit electrically connected to the first control electrode and the third control electrode.

* * * * *